(12) United States Patent
Loebl et al.

(10) Patent No.: US 7,119,637 B2
(45) Date of Patent: Oct. 10, 2006

(54) FILTER SYSTEM COMPRISING A BULK ACOUSTIC WAVE RESONATOR

(75) Inventors: Hans Peter Loebl, Monschau-Imgenbroich (DE); Mareike Katharine Klee, Hueckelhoven (DE); Robert Frederick Milsom, Redhill (GB); Christof Metzmacher, Aachen (DE); Wolfgang Brand, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/486,451

(22) PCT Filed: Aug. 2, 2002

(86) PCT No.: PCT/IB02/03263

§ 371 (c)(1),
(2), (4) Date: Sep. 27, 2004

(87) PCT Pub. No.: WO03/017480

PCT Pub. Date: Feb. 27, 2003

(65) Prior Publication Data

US 2005/0030127 A1    Feb. 10, 2005

(30) Foreign Application Priority Data

Aug. 14, 2001 (EP) .................. 01306932

(51) Int. Cl.
*H03H 9/54* (2006.01)
*H03H 9/15* (2006.01)

(52) U.S. Cl. ............ 333/187; 310/321; 310/335; 333/189; 333/133

(58) Field of Classification Search .......... None
See application file for complete search history.

(56) References Cited

U.S. PATENT DOCUMENTS

| 5,373,268 | A | * | 12/1994 | Dworsky et al. ........... 333/187 |
| 5,646,583 | A | | 7/1997 | Seabury et al. ............. 333/187 |
| 6,087,198 | A | * | 7/2000 | Panasik ....................... 438/51 |
| 6,975,182 | B1 | * | 12/2005 | Loebl et al. ................. 333/187 |

* cited by examiner

Primary Examiner—Barbara Summons
(74) Attorney, Agent, or Firm—Aaron Waxler; Paul Im

(57) ABSTRACT

The invention relates to a filter device equipped with at least one bulk acoustic wave resonator, which comprises a resonator unit and a reflection element (2) comprising several layers (6, 7, 8). The layers (6, 7, 8) each comprise a mixture of at least two materials. Within each layer (6, 7, 8), the composition of the mixture varies continuously and periodically relative to the layer thickness.

7 Claims, 3 Drawing Sheets

FILTER SYSTEM COMPRISING A BULK ACOUSTIC WAVE RESONATOR

The invention relates to a filter device equipped with at least one bulk acoustic wave resonator, which comprises a resonator unit and a reflection element. The invention also relates to a wireless data transmission system, a transmitter, a receiver and a mobile radio device equipped with a filter arrangement. The invention also relates to a bulk-wave resonator.

The very rapid developments in the area of mobile radio and the constant miniaturization of cordless telephones are leading to more stringent requirements as regards the individual components. A high degree of selectivity is necessary in the high-frequency section in order to protect the receiver from the increasing number of possibly interfering signals from other systems. This is achieved, for example, by bandpass filters, which allow only a limited frequency band through and suppress all frequencies above and below this range.

Such a filter may be, for example, a bulk acoustic wave filter comprising bulk acoustic wave resonators which are also designated Bulk Acoustic Wave (BAW) filters. Bulk acoustic wave resonators consist in principle of three components. The first component generates the acoustic wave and comprises a piezoelectric layer. Two electrodes, which are affixed above and below the piezoelectric layer, represent the second component. The third component, i.e. the reflection element, has the task of isolating the substrate acoustically from the oscillations generated by the piezoelectric layer.

One option for the acoustic isolation of the substrate from the oscillations of the piezoelectric layer is formed by acoustic interference filters, which comprise several $\lambda/4$ layers of materials with a high and low acoustic impedance. A bulk acoustic wave resonator of this kind is known from, for example, U.S. Pat. No. 5,646,583.

Particularly in the passband of a filter arrangement comprising bulk acoustic wave resonators, suitable acoustic decoupling of the bulk acoustic wave resonators from the substrate is necessary in order to achieve a good quality of the bulk acoustic wave resonators.

It is therefore an object of the invention to provide a filter device with at least one bulk acoustic wave resonator, which, particularly in the passband of the filter arrangement, exhibits efficient acoustic isolation of the substrate from the oscillations of the piezoelectric layer.

This object is achieved by a filter device equipped with at least one bulk acoustic wave resonator, which comprises a resonator unit and a reflection element, wherein reflection element comprises several layers, which each comprise a mixture of at least two materials, wherein, within each layer, the composition of the mixture varies continuously and periodically relative to the layer thickness.

Filter devices of this kind exhibit in the passband of the bulk acoustic wave filter device a suitable acoustic decoupling of the bulk acoustic wave resonators from the substrate. In addition, outside the passband, the reflection element exhibits a high transmission for acoustic waves, so the bulk acoustic wave filter device is suitably coupled to the substrate in this area. As a result, higher harmonic frequencies outside the passband are very effectively suppressed and the filter arrangement exhibits no undesired resonances here. Overall, a filter device of this kind is equipped with a clearly defined stop band.

It is preferred if the reflection element comprises a mixture of $SiO_2$ and $Ta_2O_5$ or $SiO_2$ and $Si_3N_4$.

These materials and mixtures of these materials all have good electrical insulation properties, and can easily be produced and applied to a substrate.

The invention also relates to a transmitter, a receiver, a mobile radio device and a wireless data transmission system equipped with a filter device with at least one bulk acoustic wave resonator, which comprises a resonator unit and a reflection element, wherein the reflection element comprises multiple layers, which each comprise a mixture of at least two materials, wherein, within each layer, the composition of the mixture varies continuously and periodically relative to the layer thickness. The invention also relates to a bulk acoustic wave resonator, which comprises a resonator unit and a reflection element, wherein the reflection element comprises multiple layers, which each comprise a mixture of at least two materials, wherein, within each layer, the composition of the mixture varies continuously and periodically relative to the layer thickness.

The invention will be described in detail hereinafter with reference to five Figures and three embodiments, to which, however, the invention is not restricted.

Figure 1:
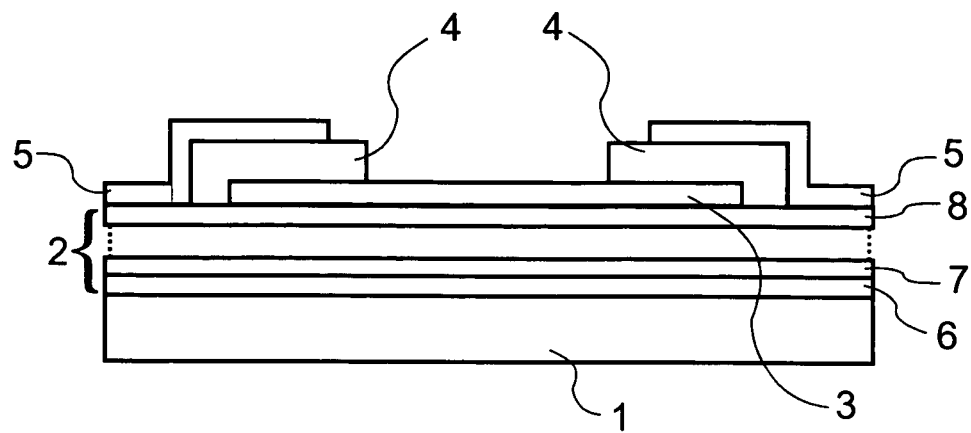
FIG. 1 is a cross-sectional representation of the structure of a filter arrangement of bulk acoustic wave resonators.
Figure 2:
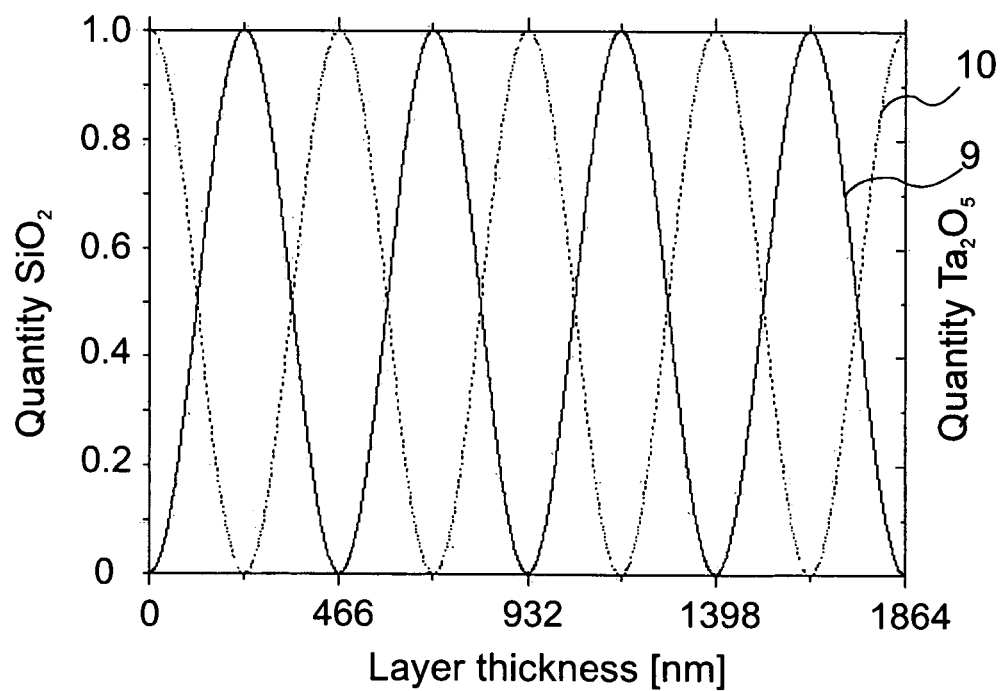
FIG. 2 shows the periodic variation of the composition of a mixture comprising at least two materials in the reflection element of a bulk acoustic wave filter device.

According to FIG. 1, a bulk acoustic wave filter device comprises a substrate 1 which consists for example of a ceramic material, a ceramic material with a planarization layer of glass, a glass-ceramic material, a glass material, a semiconductor material, such as for example silicon, GaAs, InP, SiC or GaN, or sapphire. If a semiconductor material is used as the substrate 1, a passivation layer of $SiO_2$ or glass, for example, may also be applied. A reflection element 2 is located on the substrate 1. The reflection element 2 comprises a plurality of layers 6, 7, 8. The total number of layers of reflection element 2 is preferably between 3 and 12. The layers 6, 7, 8 of the reflection element 2 comprise a mixture of at least two materials. The layers 6, 7, 8 preferably comprise a mixture of $SiO_2$ and $Ta_2O_5$ or $SiO_2$ and $Si_3N_4$. It is advantageous if the mixture is an amorphous mixture. The composition within a layer varies continuously and periodically, for instance sinusoidally, with layer thickness d as a period, relative to the direction of layer thickness d, as shown in FIG. 2. The layer thickness d of each layer is derived from the formula:

$$d = \frac{(v_{Material1} + v_{material2})}{4f_c}$$

wherein $v_{Material1}$ is the acoustic velocity of the first material of the mixture, $v_{Material2}$ is the acoustic velocity of the second material of the mixture, and $f_c$ is the operating frequency of the bulk acoustic wave filter device at which the reflection of the reflection element 2 should be 100%.

On the reflection element 2 are positioned resonator units, which each comprise a first electrode 3, a piezoelectric layer 4 and a second electrode 5.

The electrodes 3 and 5 are preferably made of a suitably conductive material with low acoustic absorption.

Examples of materials that may be used as the material for the piezoelectric layer 4 are AlN, ZnO, $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(K_{1-x}Na_x)NbO_3$ ($0 \leq x \leq 1$), $KTaO_3$, $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0 \leq x \leq 1$), $a(Bi_xNa_{1-x})TiO_{3-b}(KNbO_{3-c})\frac{1}{2}(Bi_2O_3$—$Sc_2O_3)$ ($0 \leq x \leq 1$, $a+b+c=1$), $(Ba_aSr_bCa_c)Ti_xZr_{1-x}O_3$ ($0 \leq x \leq 1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ and $PbZr_xTi_{1-x}O_3$ ($0 \leq x \leq 1$) with and without dopants of La, Mn, Fe, Sb, Sr, Ni or combinations of these dopants.

A protective layer of an organic or an inorganic material or a combination of these materials may be applied above the filter device. Examples of organic materials that may be used are polybenzocyclobutene or polyimide, and examples of inorganic materials are $Si_3N_4$, $SiO_2$ or $Si_xO_yN_z$ ($0 \leq x \leq 1$, $0 \leq y \leq 1$, $0 \leq z \leq 1$). Alternatively, a thin layer of $SiO_2$ may be applied to one or more bulk acoustic wave resonators of the filter device for specific detuning of the bulk acoustic wave resonator. It may be preferable for the thin layer of $SiO_2$ to be applied only to the second electrode 5 of a bulk acoustic wave resonator. The layer thickness of the thin layer of $SiO_2$ preferably amounts to between 10 and 100 nm.

Production of a reflection element 2, which comprises layers 6, 7, 8 made of a mixture whose composition varies continuously and periodically, may take place by, for instance, plasma-enhanced chemical vapor deposition (PECVD).

For production of layers 6, 7, 8 comprising $SiO_2$ and $Ta_2O_5$, the volume of fed-in gases, for instance $Si(OC_2H_5)_4$, $Ta(OC_2H_5)_5$ and $O_2$, is varied continuously periodically. For production of layers 6, 7, 8 comprising $SiO_2$ and $Si_3N_4$, the volume of fed-in gases, for instance $SiH_4$, $N_2O$ and $NH_3$, is varied continuously periodically.

A filter device in accordance with the invention may be used, for instance, for signal filtering in a wireless data transmission system, in a mobile radio device, in a transmitter or in a receiver.

Embodiments of the invention representing examples of implementation are described below.

COMPARISON EXAMPLE

Embodiment 1

A filter device made of bulk acoustic wave resonators with a reflection element 2 made of interference layers is applied to a substrate 1 made of silicon. To this end, a reflection element 2, which comprises seven layers of alternating $SiO_2$ and $Ta_2O_5$, is applied to the substrate 1. The first layer 6 on the substrate 1 comprises $SiO_2$. The layer thickness of the layers with $SiO_2$ was 524 nm, and the layer thickness of the layers with $Ta_2O_5$ was 409 nm. On the topmost layer 8 of reflection element 2, which comprises $SiO_2$, are located the individual bulk acoustic wave resonators, which each comprise a first electrode 3, a piezoelectric layer 4 and a second electrode 5. The first electrode 3 comprises Al with a layer thickness of 300 nm. A 1381 nm thick layer of AlN is applied to each first electrode 3 as the piezoelectric layer 4. On each piezoelectric layer 4 is located a 150 nm thick second electrode 5 made of Al. The individual bulk acoustic wave resonators are electrically connected on substrate 1 in such a way that a filter device for the frequency 2.85 GHz was obtained.

Figure 3:
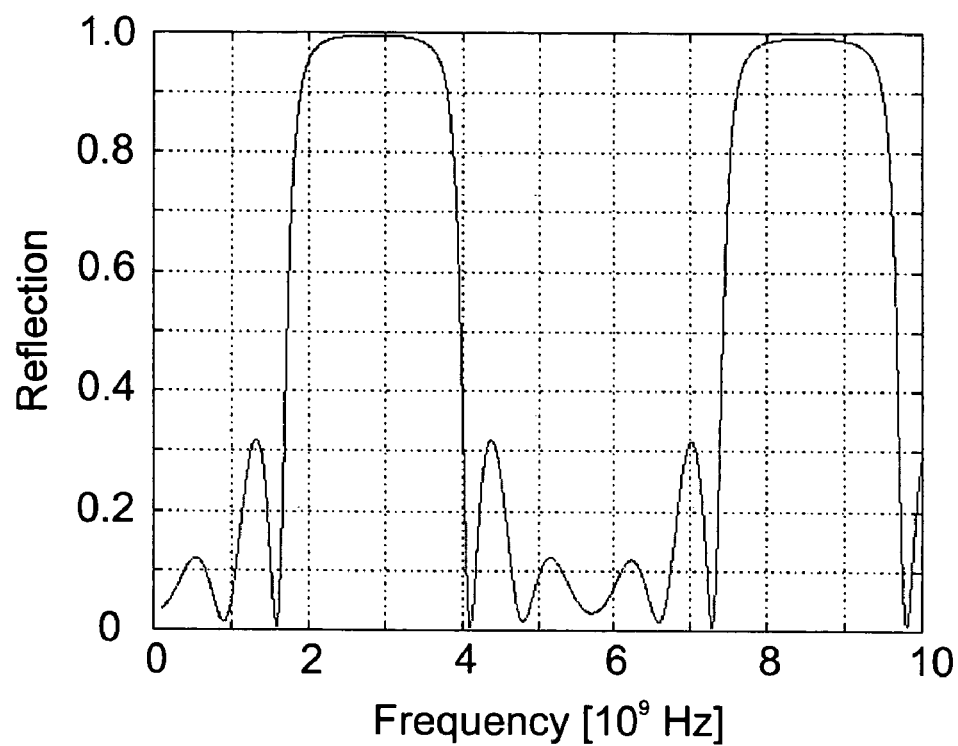
FIG. 3 shows the reflection behavior of a reflection element comprising interference layers.

FIG. 3 shows the reflection behavior of the reflection element 2 of this filter arrangement.

Embodiment 2

A filter device made of bulk acoustic wave resonators with a reflection element 2 is applied to a substrate 1 made of silicon. To this end, a reflection element 2, which comprises ten layers, is applied to the substrate 1. Each layer comprises a mixture of $SiO_2$ and $Ta_2O_5$; the quantity of each component in a layer 6, 7, 8 varies sinusoidally with the layer thickness d of a layer 6, 7, 8 constituting the period. FIG. 2 shows the composition within the layers 6, 7, 8 relative to the layer thickness. Curve 9 corresponds to $Ta_2O_5$, and curve 10 to $SiO_2$. The layer thickness d of each layer 6, 7, 8 was 466 nm. On the topmost layer 8 of reflector element 2 are located the individual bulk acoustic wave resonators, which each comprise a first electrode 3, a piezoelectric layer 4, and a second electrode 5. The first electrode 3 comprises Al with a layer thickness of 200 nm. A 1679 nm thick layer of AlN is applied to each first electrode 3 as the piezoelectric layer 4. On each piezoelectric layer 4 is located a 200 m thick second electrode 5 made of Al. The individual bulk acoustic wave resonators are electrically connected on substrate 1 in such a way that a filter device for the frequency 2.85 GHz was obtained.

Figure 4:
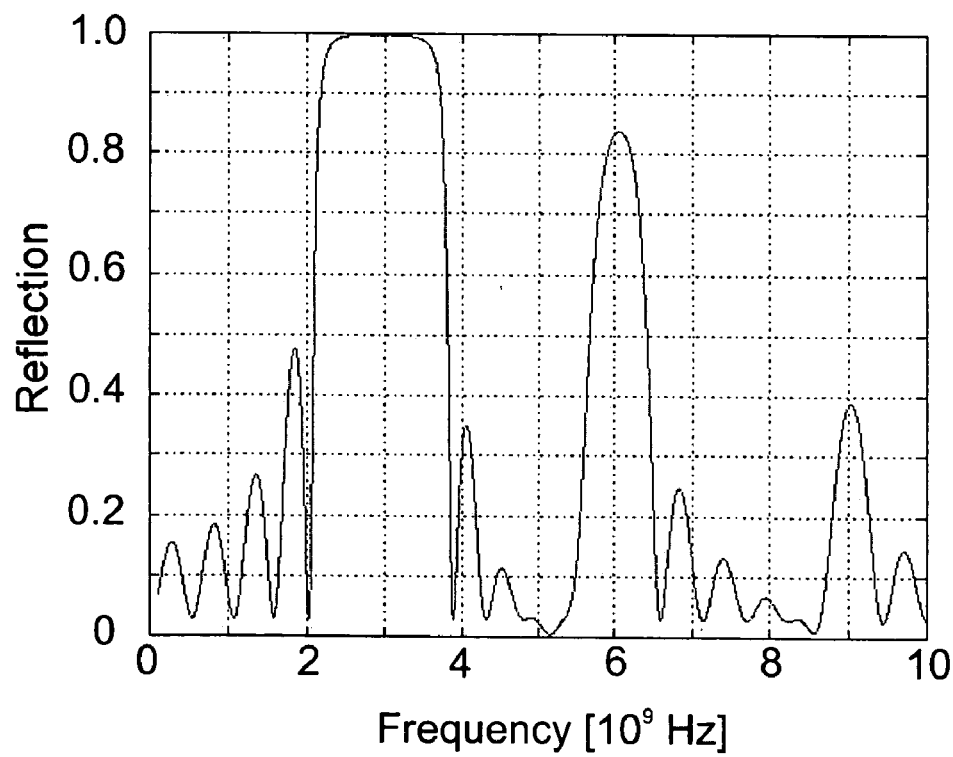
FIG. 4 and FIG. 5 show the reflection behavior of reflection elements in accordance with the invention.

FIG. 4 shows the reflection behavior of the reflection element 2 of this filter device. A filter device of this kind was used for signal filtering in the high-frequency section of a mobile radio device.

Embodiment 3

A filter device made of bulk acoustic wave resonators with a reflection element 2 is applied to a substrate 1 made of silicon. To this end, a reflection element 2, which comprises ten layers, is applied to the substrate 1. Each layer comprises a mixture of $SiO_2$ and $Si_3N_4$; the quantity of each component in a layer 6, 7, 8 varies sinusoidally with the layer thickness d constituting the period. The layer thickness d of each layer 6, 7, 8 was 744 nm. On the topmost layer 8 of reflector element 2 are located the individual bulk acoustic wave resonators, which each comprise a first electrode 3, a piezoelectric layer 4, and a second electrode 5. The first electrode 3 comprises Al with a layer thickness of 200 nm. A 1650 nm thick layer of AlN is applied to each first electrode 3 as the piezoelectric layer 4. On each piezoelectric layer 4 is located a 200 nm thick second electrode 5 made of Al. The individual bulk acoustic wave resonators are electrically connected on the substrate 1 in such a way that a filter device for the frequency 2.85 GHz was obtained.

Figure 5:
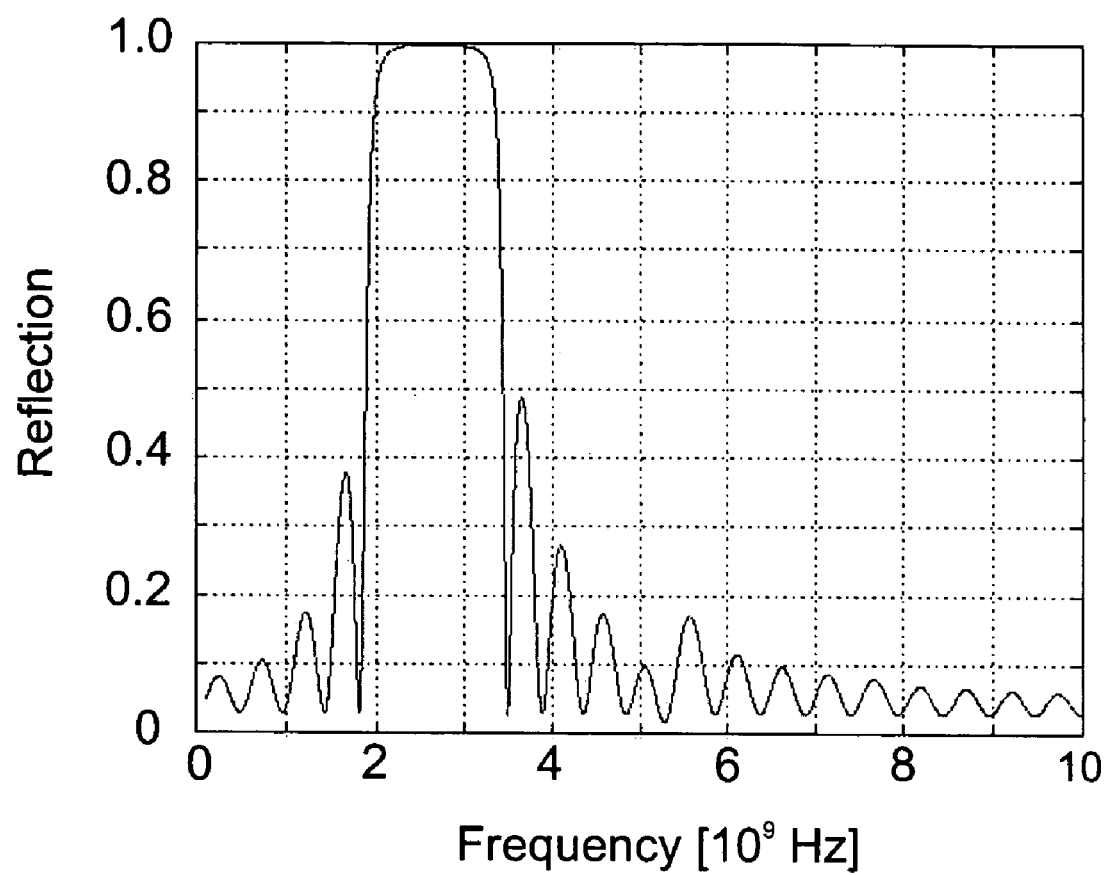

FIG. 5 shows the reflection behavior of reflection element 2 of this filter device. A filter device of this kind was used for signal filtering in the high frequency section of a mobile radio device.

The invention claimed is:

1. A filter device equipped with at least one bulk acoustic wave resonator, which comprises a resonator unit and a reflection element (2), wherein the reflection element (2) comprises several layers (6, 7, 8), which each comprise a mixture of at least two materials, wherein, within each layer (6, 7, 8), the composition of the mixture varies continuously and periodically relative to the layer thickness.

2. A filter device as claimed in claim 1, characterized in that the reflection element (2) comprises a mixture of $SiO_2$ and $Ta_2O_5$ or $SiO_2$ and $Si_3N_4$.

3. A mobile radio device equipped with a filter device with at least one bulk acoustic wave resonator, which comprises a resonator unit and a reflection element (2), wherein the reflection element (2) comprises several layers (6, 7, 8), which each comprise a mixture of at least two materials, wherein, within each layer (6, 7, 8), the composition of the mixture varies continuously and periodically relative to the layer thickness.

4. A transmitter equipped with a filter device with at least one bulk acoustic wave resonator, which comprises a resonator unit and a reflection element (2), wherein the reflector element (2) comprises several layers (6, 7, 8), which each comprise a mixture of at least two materials, wherein, within each layer (6, 7, 8), the composition of the mixture varies continuously and periodically relative to the layer thickness.

5. A receiver equipped with a filter device with at least one bulk acoustic wave resonator, which comprises a resonator unit and a reflection element (2), wherein the reflection element (2) comprises several layers (6, 7, 8), which each comprise a mixture of at least two materials, wherein, within each layer (6, 7, 8), the composition of the mixture varies continuously and periodically relative to the layer thickness.

6. A wireless data transmission system equipped with a filter device with at least one bulk acoustic wave resonator, which comprises a resonator unit and a reflection element (2), wherein the reflector element (2) comprises multiple layers (6, 7, 8), which each comprise a mixture of at least two materials, wherein, within each layer (6, 7, 8), the composition of the mixture varies continuously and periodically relative to the layer thickness.

7. A bulk acoustic wave resonator, which comprises a resonator unit and a reflection element (2), wherein the reflection element (2) comprises several layers (6, 7, 8), which each comprise a mixture of at least two materials, wherein, within each layer (6, 7, 8), the composition of the mixture varies continuously and periodically relative to the layer thickness.

* * * * *